United States Patent
Landru

(12) 
(10) Patent No.: US 9,607,879 B2
(45) Date of Patent: Mar. 28, 2017

(54) PROCESS FOR FABRICATION OF A STRUCTURE WITH A VIEW TO A SUBSEQUENT SEPARATION

(71) Applicant: Soitec, Crolles (FR)

(72) Inventor: Didier Landru, Champ Pres Froges (FR)

(73) Assignee: SOITEC, Bernin (FR)

( * ) Notice: Subject to any disclaimer, the term of this patent is extended or adjusted under 35 U.S.C. 154(b) by 29 days.

(21) Appl. No.: 14/425,205

(22) PCT Filed: Sep. 3, 2013

(86) PCT No.: PCT/IB2013/001906
§ 371 (c)(1),
(2) Date: Mar. 2, 2015

(87) PCT Pub. No.: WO2014/037784
PCT Pub. Date: Mar. 13, 2014

(65) Prior Publication Data
US 2015/0214098 A1 Jul. 30, 2015

(30) Foreign Application Priority Data
Sep. 7, 2012 (FR) ..................... 12 58394

(51) Int. Cl.
*B23P 19/00* (2006.01)
*B23P 19/02* (2006.01)
*H01L 21/762* (2006.01)

(52) U.S. Cl.
CPC .. *H01L 21/76251* (2013.01); *H01L 21/76254* (2013.01); *Y10T 29/49822* (2015.01)

(58) Field of Classification Search
CPC ......... H01L 21/76251; H01L 21/76254; H01L 21/76259; Y10T 29/49822; Y10T 29/49815; Y10T 29/49817; Y10T 29/49821
(Continued)

(56) References Cited

U.S. PATENT DOCUMENTS 5,985,742 A * 11/1999 Henley ................. B81C 1/0038
257/E21.088
6,460,245 B1 * 10/2002 DiStefano ............. H01L 21/565
156/289
(Continued)

FOREIGN PATENT DOCUMENTS

FR 2857983 A1 1/2005

OTHER PUBLICATIONS

Bagdahn et al., Chapter 14, entitled "Debonding of Wafer Bonded Interfaces for Handling and Transfer Applications" in the book "Wafer Bonding: Applications and Technology", Springer, 2004, pp. 473-493.
(Continued)

*Primary Examiner* — Sarang Afzali
*Assistant Examiner* — Darrell C Ford
(74) *Attorney, Agent, or Firm* — TraskBritt

(57) ABSTRACT

A process for fabrication of a structure includes assembling at least two substrates. At least one of these two substrates is intended to be used in electronics, optics, optoelectronics and/or photovoltaics. The structure includes at least two separation interfaces extending parallel to the main faces of the structure. The assembling process is carried out with a view to a separation of the structure along one interface selected from the interfaces, the separation being carried out by inserting a blade between the substrates and applying a parting force, via the blade. The interface chosen for the
(Continued)

separation is formed so that it is more sensitive than the other interface(s) to stress corrosion. Separation occurs due to the combined action of the parting force and of a fluid capable of breaking siloxane (Si—O—Si) bonds present at the interface. A structure obtained by such a process may be separated along the chosen interface.

20 Claims, 2 Drawing Sheets

(58) Field of Classification Search
USPC .................. 29/426.1, 426.2, 426.4, 426.5
See application file for complete search history.

(56) References Cited

U.S. PATENT DOCUMENTS

| | | | |
|---|---|---|---|
| 7,713,369 B2* | 5/2010 | Aspar ................ H01L 21/6835 156/249 |
| 7,892,951 B2 | 2/2011 | Landru et al. | |
| 8,429,960 B2 | 4/2013 | Landru | |
| 8,497,190 B2 | 7/2013 | Landru et al. | |
| 8,501,537 B2 | 8/2013 | Sadaka et al. | |
| 8,507,332 B2 | 8/2013 | Riou et al. | |
| 8,513,092 B2 | 8/2013 | Landru | |
| 8,614,501 B2 | 12/2013 | Landru | |
| 8,623,740 B2 | 1/2014 | Landru et al. | |
| 8,716,105 B2 | 5/2014 | Sadaka et al. | |
| 9,362,439 B2* | 6/2016 | Henley ................. H01L 31/18 |
| 2003/0175154 A1* | 9/2003 | Hsu ........................ B82Y 10/00 438/99 |
| 2004/0245521 A1* | 12/2004 | Faris ................... B81C 1/00071 257/40 |
| 2006/0054891 A1* | 3/2006 | Chu ................. H01L 21/76254 257/65 |
| 2006/0270175 A1* | 11/2006 | Aoki ................... H01L 21/6835 438/381 |
| 2007/0122997 A1* | 5/2007 | Henley ................. B81C 1/0038 438/458 |
| 2007/0232022 A1* | 10/2007 | Henley ............. H01L 21/76254 438/455 |
| 2008/0242051 A1* | 10/2008 | Yamazaki ......... H01L 21/76254 438/458 |
| 2008/0261055 A1* | 10/2008 | Chu ..................... C23C 16/029 428/428 |
| 2008/0268583 A1* | 10/2008 | Yamazaki ......... H01L 21/76254 438/151 |
| 2009/0050941 A1* | 2/2009 | Yamazaki ......... H01L 21/76254 257/255 |
| 2009/0098709 A1* | 4/2009 | Ohnuma ........... H01L 21/76254 438/458 |
| 2009/0111243 A1 | 4/2009 | Landru et al. | |
| 2009/0209086 A1* | 8/2009 | Tanaka .............. H01L 21/76254 438/458 |
| 2010/0282323 A1* | 11/2010 | Henley ................. B81C 1/0038 136/261 |
| 2010/0289189 A1* | 11/2010 | Lichtensteiger .. H01L 21/76251 264/492 |
| 2011/0165758 A1 | 7/2011 | Bourdelle et al. | |
| 2011/0177673 A1 | 7/2011 | Landru | |
| 2011/0193201 A1 | 8/2011 | Kononchuk et al. | |
| 2011/0207295 A1 | 8/2011 | Landru et al. | |
| 2011/0266651 A1 | 11/2011 | Riou et al. | |
| 2011/0278597 A1 | 11/2011 | Landru | |
| 2012/0048007 A1 | 3/2012 | Landru | |
| 2012/0094469 A1 | 4/2012 | Landru | |
| 2012/0231636 A1 | 9/2012 | Landru et al. | |
| 2012/0252162 A1 | 10/2012 | Sadaka et al. | |
| 2012/0252189 A1 | 10/2012 | Sadaka et al. | |
| 2012/0329243 A1 | 12/2012 | Letertre et al. | |
| 2013/0216820 A1* | 8/2013 | Riddle ..................... C09D 4/00 428/313.9 |
| 2014/0030877 A1 | 1/2014 | Landru et al. | |
| 2014/0326416 A1 | 11/2014 | Landru | |
| 2014/0357093 A1 | 12/2014 | Landru et al. | |
| 2015/0214098 A1* | 7/2015 | Landru ............. H01L 21/76251 29/426.5 |
| 2015/0221544 A1* | 8/2015 | Landru ............. H01L 21/76251 438/458 |
| 2016/0163535 A1* | 6/2016 | Renauld ........... H01L 21/76254 438/455 |
| 2016/0307792 A1* | 10/2016 | Werner ............. H01L 21/76251 |

OTHER PUBLICATIONS

International Written Opinion for International Application No. PCT/IB2013/001906 dated Nov. 19, 2013, 5 pages.
International Preliminary Report on Patentability for International Application No. PCT.IB2013/001906 dated Mar. 10, 2015, 6 pages.
International Search Report for International Application No. PCT/IB2013/001906 dated Nov. 19, 2013, 2 pages.
Maszara et al, Bonding of Silicon Wafers for Silicon-on-Insulator, J. Appl. Phys., vol. 64, No. 10, (Nov. 15, 1988), pp. 4943-4950.

* cited by examiner

PROCESS FOR FABRICATION OF A STRUCTURE WITH A VIEW TO A SUBSEQUENT SEPARATION

CROSS-REFERENCE TO RELATED APPLICATIONS

This application is a national phase entry under 35 U.S.C. §371 of International Patent Application PCT/IB2013/001906, filed Sep. 3, 2013, designating the United States of America and published as International Patent Publication WO 2014/037784 A1 on Mar. 13, 2014, which claims the benefit under Article 8 of the Patent Cooperation Treaty to French Application Serial No. 1258394, filed Sep. 7, 2012, the disclosure of each of which is hereby incorporated herein in its entirety by this reference.

TECHNICAL FIELD

The invention relates to a process for fabrication of a structure by assembling at least two substrates, at least one of these two substrates being intended to be used in electronics, optics, optoelectronics and/or photovoltaics, with a view to a subsequent separation of the substrates along a predetermined separation interface.

BACKGROUND

One particular case of such a structure is a debondable structure, in which the separation interface is an interface along which bonding via molecular adhesion has been carried out.

The expression "bonding via molecular adhesion" denotes bonding via intimate contact of the surfaces of the two substrates, employing adhesion forces, mainly van der Waals' forces, and not using an adhesive layer.

Without wishing to be limiting, it may, however, be considered that a debondable structure may be used mainly in four different applications:

a) bonding of a mechanical stiffener: it may be desirable to bond a mechanical stiffener to a weak substrate or thin layer in order to prevent damaging or breaking it during certain fabrication steps, then to be able to remove this mechanical stiffener when its presence is no longer needed.

b) rectifying poor bonding: debonding makes it possible to debond two substrates that might not have been correctly bonded a first time, then to rebond them after cleaning, in order to improve the profitability of a fabrication process and to avoid, for example, scrapping poorly bonded substrates.

c) temporary protection: during certain steps of storing or transporting substrates, especially in plastic boxes, it may be useful to temporarily protect their surfaces, especially those intended to be used subsequently for the fabrication of electronic components, in order to avoid any risk of contamination. One simple solution consists in bonding two substrates so that the faces thereof to be protected are bonded, respectively, to one another, then in debonding these two substrates during the final use thereof.

d) double transfer of a layer: this consists in producing a reversible bonding interface between an active layer and a first support substrate (optionally made of an expensive material), then in transferring this active layer to a second final substrate, by debonding the reversible bonding interface.

However, applications may also be found in which it is desired to separate a structure formed of two assembled substrates, along an interface, which is not a bonding interface.

Such an interface may be, for example, an interface between a first material and a second material, which may have been joined to one another by an addition of the second material to the first, for example, via deposition, epitaxy, etc.

As a variant, such an interface may be, for example, a weak zone formed within a material and marked by the presence of bubbles, inclusions, etc.

Separation along an interface, which is not a bonding interface, may in particular find an application in the transfer of a layer from a first substrate to a second substrate.

The layer to be transferred may, thus, not have been formed by bonding to the first substrate but, for example, may have been formed by epitaxy or deposition on the substrate, or, alternatively, may be part of a thicker layer within which it has been delimited by a layer of bubbles that weakens the thick layer.

Irrespective of the envisaged applications, it is necessary to carry out this separation without damaging, scratching or contaminating the surface of the two substrates located on either side of the separation interface and without breaking these two substrates.

Depending on the various applications, these two "substrates to be separated" may be two layers of one and the same substrate or two different substrates.

Moreover, the larger the dimensions of the two substrates of the structure to be separated or the higher their bond energy, the more difficult the separation is to carry out, in particular without damage.

Furthermore, it is known from the research studies by Maszara regarding the measurement of the bonding energy between two substrates (see the article by W. P. Maszara, G. Goetz, A. Caviglia and J. B. McKitterick: J. Appl. Phys. 64, (1988), 4943) that it is possible to measure the bonding energy between two substrates, by introducing a thin blade between the two, at their bonding interface.

Maszara established the following relationship:

$$L = \sqrt[4]{\frac{3Et^3d^2}{32\gamma}}$$

in which d represents the thickness of the blade inserted between the two bonded substrates, t represents the thickness of each of the two bonded substrates, E represents the Young's modulus along the debonding axis, $\gamma$ represents the bonding energy and L represents the length of the crack between the two substrates at equilibrium.

The above formula starts from the hypothesis that the two substrates are of identical dimensions.

Owing to the aforementioned relationship, it is possible, by measuring L, to determine the bonding energy $\gamma$.

This definition of the "bonding" energy is based on the hypothesis that the energy needed to separate the two substrates, or rupture energy of the interface (which is the energy actually measured by the method using a blade) is equal to the bonding energy of the substrates.

In reality, during the separation of the substrates, a portion of the energy is dissipated not in the rupture of the interface itself but in other phenomena, such as deformations of the material(s) present at the interface.

In the remainder of the text, the rupture energy of an interface will, therefore, denote the energy to be provided in order to separate two substrates or layers along the interface.

Insofar as these substrates or layers to be separated are stiff enough to be separated with a blade, it is possible to separate them by parting them sufficiently from one another, at their bevelled edge, which has the effect of creating a separation wave.

This wave propagates from the point of the edge of the substrates where it is initiated, across the entire surface of these substrates, along the separation interface.

When the structure consisting of the two substrates contains only one separation interface, the insertion of a blade between the two substrates and the application, via the blade, of a parting force on the substrates will have the effect of separating the substrates along the interface.

However, situations are frequently encountered in which the structure comprises more than one separation interface.

FIG. 1 schematically illustrates such a situation, in which the structure S is formed from a first substrate S1 and from a second substrate S2 and comprises two separation interfaces I1, I2, respectively, having rupture energies γ1, γ2.

For example, the substrates S1 and S2 may have been bonded along the interface I2, whilst the interface I1 is an interface formed during the epitaxy of a material on a support, the material and the support together forming the substrate S1.

If the energy γ2 is lower than the energy γ1, when a blade B is inserted between the two substrates S1, S2, the separation will preferably take place along the interface I2 having the lowest rupture energy.

However, it is not necessarily along this interface that it is desired to carry out the separation.

Indeed, it may be preferred to carry out the separation along an interface having a higher rupture energy.

However, the method of inserting the blade does not make it possible to influence the interface along which the separation is initiated.

It is, furthermore, known to use a phenomenon referred to as "stress corrosion" to accelerate the separation of the substrates.

Stress corrosion consists in combining the parting force of the blade with the application of a fluid to the separation interface.

Stress corrosion is particularly benefited from when at least one of the substrates is made of silicon and when the interface comprises silicon oxide, whether it is a native oxide or an oxide formed intentionally, for example, in order to form a bonding layer or an insulating layer.

This is because such an interface contains siloxane (Si—O—Si) bonds that are broken by water molecules provided by the fluid.

The rupture energy of the interface is, thus, significantly reduced.

Chapter 14, entitled "Debonding of Wafer-Bonded Interfaces for Handling and Transfer Applications," by J. Bagdahn and M. Petzold, in the book "Wafer Bonding: Applications and Technology," edited by M. Alexe and U. Gösele, Springer, 2004, describes this stress corrosion phenomenon and proposes various applications.

In particular, this document especially envisages a transfer process for producing microelectromechanical systems (MEMS), in which a substrate of silicon-on-insulator (SOI) type is bonded to a silicon substrate having a cavity, then the SOI is debonded along the interface between the thin layer of silicon and the buried oxide layer.

Stress corrosion makes it possible to reduce the rupture energy of the interface even if, due to a heat treatment for strengthening the interface, it initially has a higher energy than that of the other interface.

However, insofar as the interface between the thin layer of silicon, and the buried oxide layer of the SOI has a rupture energy higher than that of the interface between the SOI and the silicon substrate, the authors do not explain how they succeed in starting the debonding along this first interface.

Consequently, the means for the concrete implementation of this process are not defined.

One objective of the invention is to be able to separate a structure comprising several interfaces by taking advantage of stress corrosion, but by controlling, among these various interfaces, the interface along which the separation must take place.

One objective of the invention is, thus, to solve the problems described above, and to propose a process for fabrication of a structure by assembling at least two substrates, the structure comprising at least two separation interfaces, making it possible to select the interface along which a separation, assisted by stress corrosion, will take place.

BRIEF SUMMARY

In accordance with the invention, a process is proposed for fabrication of a structure by assembling at least two substrates, at least one of these substrates being intended to be used in electronics, optics, optoelectronics and/or photovoltaics, the structure comprising at least two separation interfaces extending parallel to the main faces of the structure, with a view to a subsequent separation of the structure along one interface selected from the interfaces, the separation being carried out by inserting a blade between the substrates and applying a parting force, via the blade, for parting the two substrates, the process being characterized in that it comprises the formation of the interface chosen for the separation so that it is more sensitive than the other interface(s) to stress corrosion, that is to say to the combined action of the parting force and of a fluid capable of breaking siloxane (Si—O—Si) bonds present at the interface.

In the present text, the term "substrate" covers a single-layer or multilayer substrate, the periphery of which has a bevel, against which a blade may bear in order to part two bonded substrates. Furthermore, a substrate may itself contain one or more interfaces.

A separation interface is defined in the present text as being a physical boundary between two layers, along which a separation wave may propagate.

It is understood that the two layers in question may be made of two different materials, it being possible for the materials to be joined by any type of introduction of one material onto the other (especially epitaxy, deposition, bonding), or else may form two parts of a thicker layer, delimited by a weak zone (in particular containing bubbles, inclusions, etc.).

According to one embodiment, the chosen interface is formed between two materials, at least one of which is silicon oxide.

The other material forming the chosen interface may then be selected from silicon oxide or silicon, optionally covered with a native oxide.

According to one embodiment, the at least one other interface is formed between two materials that do not contain siloxane bonds.

Advantageously, the materials are metals.

For example, the at least one other interface is a copper/copper interface or a titanium/titanium interface.

Another subject of the invention relates to a process for separating a structure capable of being fabricated by the process described above, the process comprising the insertion of a blade between the substrates and the application of a parting force, via the blade, for parting the two substrates, the process being characterized in that a fluid that promotes the stress corrosion of the interface is applied to the chosen interface.

According to one embodiment, the at least one other separation interface is less sensitive than the chosen interface to stress corrosion and, before insertion of the blade between the substrates, the interfaces are brought into contact with the fluid that promotes stress corrosion.

For example, before and during the separation, the structure is submerged in a bath or a fluid that promotes stress corrosion is sprayed onto the structure.

According to one embodiment, the at least one other separation interface has a higher rupture energy than the chosen interface; the separation then comprises:

a first phase of initiation of the separation by insertion of the blade between the two substrates, the phase being carried out in the absence of the fluid that promotes stress corrosion; and a second phase of continuing the separation, during which the chosen interface is brought into contact with the fluid that promotes stress corrosion.

For the separation, the structure may be partially submerged in a bath of a fluid that promotes stress corrosion, the blade being inserted in an above-surface region of the structure.

During the phase of continuing the separation, a fluid that promotes stress corrosion may be sprayed in the space between the two parted substrates.

Preferably, the fluid that promotes stress corrosion is selected from deionized water, ethanol, water vapor, aqueous ammonia and hydrazine.

BRIEF DESCRIPTION OF THE DRAWINGS

Other features and advantages of the invention will emerge from the detailed description which follows, with reference to the accompanying drawings in which.

DETAILED DESCRIPTION

Fabrication of the Structure

Figure 1:
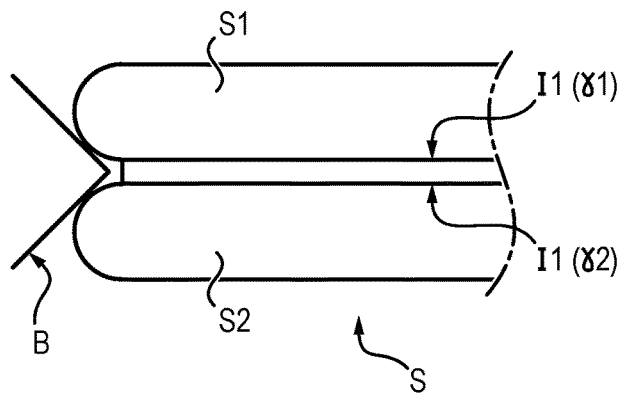
FIG. 1 is a cross-sectional view of a structure comprising two assembled substrates and having two separation interfaces.

Returning to FIG. 1, it is considered, by way of illustration, that the structure that it is desired to later separate comprises two separation interfaces I1 and I2.

The interface I1 is the interface along which it is desired to subsequently separate the structure.

During the fabrication of the structure, it is ensured that the interface I1 is sensitive to stress corrosion.

This effect is obtained by the choice of materials, on either side of the interface I1, which promote stress corrosion.

More specifically, the chosen materials on either side of the interface I1 generate siloxane bonds, which are capable of being broken by a fluid under the action of a parting force for parting the substrates S1 and S2.

The interfaces that contain such siloxane bonds are interfaces that involve in particular silicon oxide ($SiO_2$), whether it is native or formed intentionally on a support (by deposition, oxidation, etc.), silicon, when it is assembled by hydrophilic bonding, and/or silicon oxynitrides.

The materials on either side of the interface I1 may be identical or different, as long as there are siloxane bonds between the materials.

There are very many means for generating an interface comprising siloxane bonds including in particular processes of bonding, of deposition of an oxide layer, of oxidation of the silicon, of treatment of the silicon with oxygen plasma, or else of implantation of oxygen.

Thus, the interface I1 may be a bonding interface, that is to say, along which two materials have been bonded via molecular adhesion during the fabrication of one of the substrates or of the structure.

For example, the interface I1 may be formed by bonding two layers of silicon, each covered with a native oxide layer via which they are in contact.

As a variant, the interface I1 may be formed by bonding one layer of silicon, optionally covered with a native oxide layer, and one layer of silicon oxide.

Alternatively, the interface I1 may be formed by a technique other than bonding.

For example, the interface I1 may be formed by weakening a layer of a material containing siloxane bonds, for example, by ion implantation or laser illumination.

Moreover, it is ensured, during the fabrication of the structure, either that the interface I2 is insensitive to stress corrosion (or that the interface I2 is in any case less sensitive to stress corrosion than the interface I1 chosen for the separation), or that the interface I2 has a rupture energy higher than that of the interface I1, irrespective of the sensitivity of the interface I2 to stress corrosion.

The degree of sensitivity to stress corrosion of a material may be determined by measuring the difference between the rupture energy in the presence of water (or of another fluid that promotes stress corrosion) and the rupture energy in the absence of such a fluid.

In the first case, this effect is obtained by choosing materials, on either side of the interface I2, which inhibit stress corrosion.

More specifically, the chosen materials on either side of the interface I2 comprise, relative to the materials on either side of the interface I1, fewer siloxane bonds capable of being broken by a fluid under the action of a parting force for parting the substrates S1 and S2.

Generally, the use of materials containing both silicon atoms and oxygen atoms on either side of the interface I2 is avoided.

Among the suitable materials, mention may be made of metals since the bonding thereof is based on mechanisms whose chemistry does not involve siloxane bonds. Nevertheless, materials other than metals may well be suitable for the production of the interface I2.

The materials on either side of the interface I2 may be identical or different, as long as there are no siloxane bonds between the materials.

The interface I2 may be a bonding interface, that is to say, along which two materials have been bonded via molecular adhesion during the fabrication of one of the substrates or of the structure.

For example, the interface I2 may be formed by bonding two metal layers, preferably of the same metal, for example, two copper layers, two titanium layers, etc., or else, optionally, of two different metals. The interface I2 may also be an interface between a silicon layer and a metal layer.

Hydrophobic bonding of two silicon layers does not contain siloxane bonds either.

Alternatively, the interface I2 may be formed by a technique other than bonding.

For example, the interface I2 may be formed by weakening a layer of a material that does not contain siloxane bonds.

Naturally, the structure may comprise more than two separation interfaces.

In this case, it is ensured, during the fabrication of the structure, that it is the interface chosen for the separation that is the most sensitive to stress corrosion, regardless of the respective rupture energies of the chosen interface and of the other interfaces.

Alternatively to the design of the interface(s) other than the chosen interface so that it (they) is (are) insensitive to stress corrosion, it is ensured that the rupture energy of the chosen interface I1 is lower than that of the other separation interface(s), irrespective of the sensitivity of the other interfaces to stress corrosion.

A person skilled in the art is in a position to estimate the rupture energy of an interface, and to consequently choose suitable materials, or even to carry out appropriate treatments for strengthening a particular interface.

Separation of the Structure

Figure 2A:
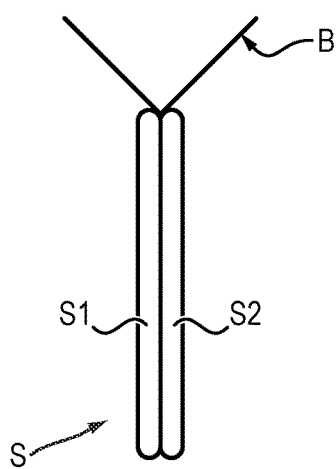
FIGS. 2A and 2B illustrate two steps of the separation of a structure along an interface.

With reference to FIG. 2A, the separation consists in inserting a blade B, preferably which is thick, between the two substrates S1, S2 of the structure S, from the periphery thereof.

The term thick is understood to mean that the blade B enables a sizeable parting of the substrates S1, S2, so as to enable the physical separation thereof without coming into contact with the front faces (i.e., the faces of the substrates S1, S2 located at the interface), in order to avoid damaging them.

Furthermore, the blade must be inserted between the substrates along a plane parallel to the plane of the separation interface.

During the separation, the substrates are held by a support (not shown) arranged so that at least one of the substrates is capable of being deformed, in order to avoid any rupture of the substrates.

Thus, according to one preferred embodiment, the structure is positioned vertically in a separation device that comprises, in its lower part, a structure-holding member and, in its upper part, a separation member that can move vertically in translation, comprising the blade, in the axis of the holding member.

The holding member comprises a groove that has a base and inclined edges on either side of the base. The base of the groove is wide enough to receive the assembled structure without exerting stress thereon, whilst the edges are high enough to prevent the substrates from falling out after their separation.

Figure 2B:
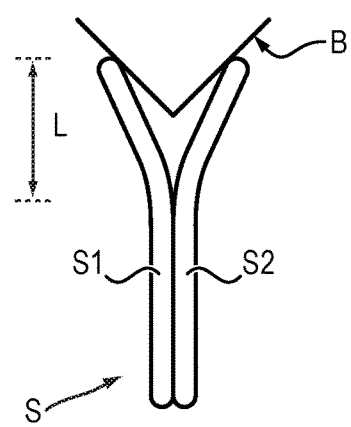

The displacement of the blade in the direction of the inside of the structure causes a wedge effect and the parting of the two portions thereof (see FIG. 2B).

This parting of the two portions over a length L has the effect of initiating the formation of a separation wave.

In the embodiment in which only the chosen separation interface is sensitive to stress corrosion, the other interfaces not being sensitive to this type of corrosion, the blade insertion region of the chosen interface is brought into contact with a fluid that promotes stress corrosion, at the latest, when the blade is inserted.

For example, the structure may be completely submerged in a bath of the fluid that promotes stress corrosion.

Alternatively, the fluid may be sprayed, preferably continuously, onto the structure, in particular at the blade insertion region.

Thus, the fluid has the effect, in combination with the parting force exerted by the blade, of breaking the siloxane bonds at the chosen interface.

This has the effect of substantially reducing the rupture energy of the chosen interface, the rupture energies of the other interfaces not being affected by the presence of the fluid.

Thus, irrespective of the rupture energies of the other interfaces, the separation is initiated and is continued preferentially along the chosen interface, due to the weakening thereof.

In the embodiment where the chosen interface is sensitive to stress corrosion while having the lowest rupture energy, "dry" separation is on the contrary initiated, i.e., separation in the absence of any fluid that promotes stress corrosion in the blade insertion region, and there is a wait until the separation is started before bringing the chosen interface into contact with a fluid that promotes stress corrosion.

Specifically, in the presence of several interfaces and in the absence of a fluid that promotes stress corrosion in the blade insertion region, the separation is initiated along the interface that has the lowest rupture energy, namely, in this particular case, the chosen interface.

If the chosen interface had been brought into contact, in the blade insertion region, with a fluid that promotes stress corrosion as soon as the blade was inserted, the fluid would have had the effect of reducing the bonding energy of the other interfaces likely to also be sensitive to stress corrosion, thus, leading to an equalizing of the rupture energies of the interfaces.

On the other hand, dry initiation makes it possible to prevent such equalizing and to initiate the separation along the chosen interface, which has the lowest rupture energy.

Once the separation is started, bringing the interface I1 into contact with a fluid that promotes stress corrosion makes it possible to facilitate and accelerate the separation by reducing the rupture energy of the interface.

Advantageously, the structure S is held in a vertical position during the separation.

This is because this position favors the flow of the fluid used for the stress corrosion along the interface I1.

In this case, the blade B is preferably vertically oriented and introduced at the top of the structure so that the separation wave moves downwards becoming horizontal as it moves away from the insertion point of the blade.

Figure 3:
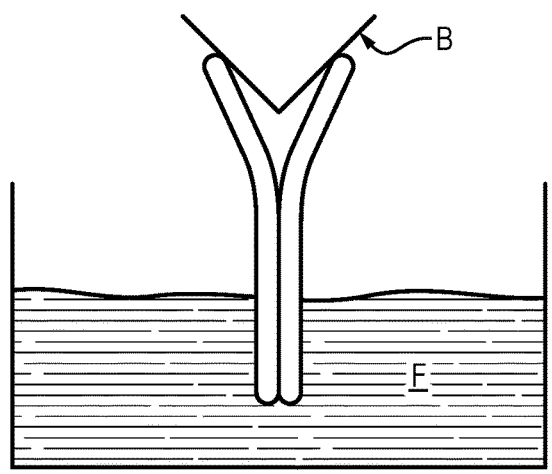
FIG. 3 illustrates an embodiment in which the structure to be separated is partially submerged in a bath of a fluid that promotes stress corrosion.

According to one embodiment, illustrated in FIG. 3, the structure is partially submerged in a bath of a fluid F that promotes stress corrosion.

Since the blade B is introduced into the above-surface part of the structure, the chosen interface I1 is not in contact with the fluid during the insertion of the blade.

It is only when the blade has sufficiently parted the two substrates that the fluid can filter into the space between the two substrates and give rise to stress corrosion.

Figure 4:
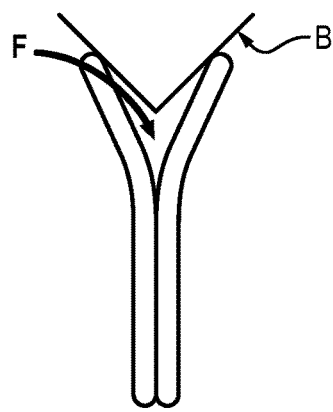
FIG. 4 illustrates an embodiment in which a fluid that promotes stress corrosion is sprayed in the space between the parted substrates.

According to another embodiment, illustrated in FIG. 4, a fluid F that promotes stress corrosion is sprayed in the space between the two substrates once the blade B has begun to part them.

Among the fluids that promote stress corrosion, mention may be made, non-limitingly, of deionized water, ethanol, water vapor, aqueous ammonia and hydrazine.

The separation described above may be obtained on structures of all dimensions.

In particular, the structure may consist of substrates of large diameter, for example, having a diameter of 300 mm.

Exemplary Embodiment

Figure 5A:
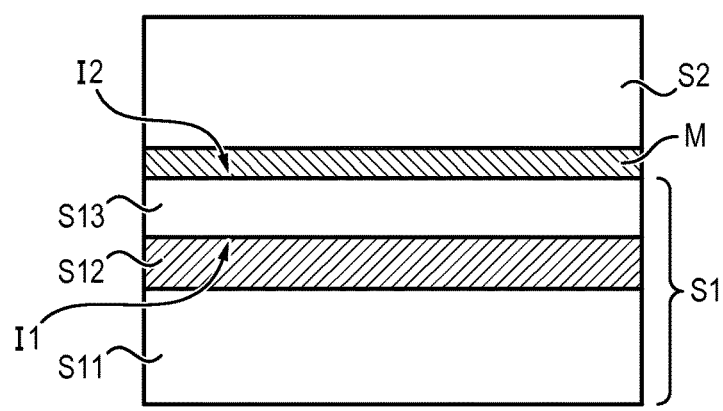
FIGS. 5A and 5B illustrate steps for carrying out a separation process according to one exemplary embodiment of the invention.

With reference to FIG. 5A, an SOI substrate S1 is bonded to a silicon substrate S2 with the aid of a metal bonding layer M (of titanium or copper, for example).

Although not represented, each of the substrates S1 and S2 has a bevel against which the separation blade may bear.

The substrate S1 successively comprises a support substrate S11, a buried silicon oxide layer S12, (usually denoted by the term "BOX," acronym for "Buried OXide"), and a thin silicon layer S13.

After stabilization annealing, the rupture energy of the interface I2 between the silicon layer S13 and the metal layer M is very high, that is to say higher than the fracture energy of the silicon, which is of the order of 2.5 J/m$^2$.

Furthermore, the rupture energy of the interface I1 between the thin silicon layer S13 and the buried oxide layer S12 is also very high (greater than 2 J/m$^2$).

It is noted that this interface I1 was not obtained by bonding but by thermal oxidation of the silicon.

Any mechanical opening (that is to say, for example, via introduction of a blade in the absence of water or of any fluid that promotes stress corrosion) of such an assembly would lead to the rupture of the substrates since the rupture energies of the interfaces I1 and I2 are too high and too close to the fracture energy of the silicon.

On the other hand, when the assembled structure is submerged in water during the separation, the rupture energy of the interface I1 is drastically lowered as it is sensitive to stress corrosion, but not the rupture energy of I2, which is insensitive thereto.

Figure 5B:
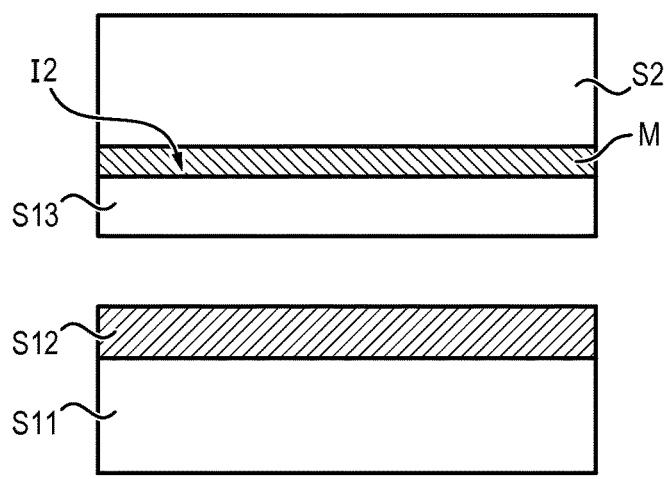

Owing to the sensitivity of the interface I1 to stress corrosion, an easy separation is, therefore, obtained at the interface I1, thus, giving rise to the transfer of the thin layer S13 of the SOI from its fabrication substrate S11 to a second substrate S2 (as shown at FIG. 5B).

The invention claimed is:

1. A process for fabrication of a substrate structure configured for use in at least one of electronics, optics, optoelectronics and photovoltaics, the process comprising:
   assembling at least two substrates to form a structure, the structure including at least two separation interfaces extending within the structure parallel to main faces of the structure, the at least two separation interfaces being parallel to each other, the at least two separation interfaces respectively located at different distances from the main faces of the structure, each of the at least two separation interfaces extending to a periphery of the structure;
   wherein siloxane bonds are present at at least one interface of the at least two separation interfaces so that the at least one interface is more sensitive than another interface of the at least two separation interfaces to stress corrosion when subjected to combined action of a parting force applied to the structure by inserting a blade between the at least two substrates and a fluid capable of breaking the siloxane bonds present at the at least one interface; and
   inserting the blade between the at least two substrates at the periphery of the structure and contacting the fluid with the at least one interface, subjecting the at least one interface to stress corrosion and breaking the siloxane bonds present at the at least one interface.

2. The process of claim 1, wherein the at least one interface is formed between two materials, at least one of the two materials being silicon oxide.

3. The process of claim 2, wherein another material of the two materials is selected from the group consisting of silicon oxide and silicon.

4. The process of claim 3, wherein the another material of the two materials comprises silicon, and wherein the silicon is covered with a native oxide.

5. The process of claim 1, wherein siloxane bonds are not present at the another interface of the at least two separation interfaces.

6. The process of claim 5, wherein the another interface of the at least two separation interfaces is formed between two materials, and each of the two materials is a metal.

7. The process of claim 6, wherein the another interface is at least one of a copper/copper interface and a titanium/titanium interface.

8. A process for separating a debondable structure, the process comprising:
   providing the debondable structure including at least two substrates assembled together, at least one of the at least two substrates being configured for use in at least one of electronics, optics, optoelectronics and photovoltaics, the debondable structure including at least two separation interfaces extending within the debondable structure parallel to main faces of the debondable structure, the at least two separation interfaces respectively located at different distances from the main faces of the debondable structure, the at least two separation interfaces being parallel to each other, each of the at least two separation interfaces extending to a periphery of the debondable structure, at least one interface of the at least two separation interfaces chosen for subsequent separation of the debondable structure along the at least one interface, the at least one interface chosen for subsequent separation formed with siloxane bonds present at the at least one interface so that the at least one interface is more sensitive than another interface of the at least two separation interfaces to stress corrosion when subjected to combined action of a parting force applied to the debondable structure by inserting a blade between the at least two substrates and a fluid capable of breaking the siloxane bonds present at the at least one interface;
   inserting the blade between the at least two substrates at the periphery of the debondable structure and applying the parting force, via the blade, to the at least two substrates, and applying the fluid to the at least one interface and using the fluid to promote the breaking of the siloxane bonds present at the at least one interface, thereby subjecting the at least one interface to stress corrosion; and
   separating the debondable structure along the at least one interface by the combined action of the parting force and the promotion of the breaking of the siloxane bonds present at the at least one interface.

9. The process of claim 8, further comprising bringing the at least two separation interfaces into contact with the fluid before inserting the blade between the at least two substrates.

10. The process of claim 8, further comprising bringing the at least two separation interfaces into contact with the fluid only after the blade is inserted between the at least two substrates.

11. The process of claim 8, wherein bringing the at least two separation interfaces into contact with the fluid comprises submerging the debondable structure in a bath of the fluid.

12. The process of claim 11, wherein the debondable structure is maintained at least partially in the bath of the fluid during the separation of the debondable structure along the at least one interface.

13. The process of claim 8, wherein bringing the at least two separation interfaces into contact with the fluid comprises spraying the fluid onto the debondable structure.

14. The process of claim 13, wherein the fluid is sprayed onto the debondable structure during the separation of the debondable structure along the at least one interface.

15. The process of claim 14, wherein the fluid is sprayed onto the debondable structure throughout an entire duration of the separation of the debondable structure along the at least one interface.

16. The process of claim 8, wherein the another interface of the at least two separation interfaces has a higher rupture energy than the at least one interface.

17. The process of claim 16, wherein the process comprises:
    a first separation initiation phase during which the blade is inserted between the at least two substrates and the parting force is applied, the first separation initiation phase carried out in the absence of the fluid that promotes the stress corrosion at a separation area of the at least one interface; and
    a second separation continuing phase during which the separation area of the at least one interface is brought into contact with the fluid that promotes the stress corrosion.

18. The process of claim 17, further comprising partially submerging the debondable structure in a bath of the fluid that promotes the stress corrosion, and wherein the insertion of the blade between the at least two substrates includes inserting the blade between the at least two substrates at a location above a surface of the bath of the fluid.

19. The process of claim 17, wherein the fluid that promotes the stress corrosion is sprayed in a space between the at least two substrates during the second separation continuing phase.

20. The process of claim 8, wherein the fluid that promotes the stress corrosion is selected from the group consisting of deionized water, ethanol, water vapor, aqueous ammonia and hydrazine.

\* \* \* \* \*